(12) United States Patent
Lu et al.

(10) Patent No.: US 12,155,001 B2
(45) Date of Patent: *Nov. 26, 2024

(54) RECEIVER WITH A LIGHT COLLECTOR ARRAY AND A MASK FOR IMPROVING DETECTION RESOLUTION DURING A SCANNING PROCEDURE OF AN OPTICAL SENSING SYSTEM

(71) Applicant: BEIJING VOYAGER TECHNOLOGY CO., LTD., Beijing (CN)

(72) Inventors: Yue Lu, Los Gatos, CA (US); Youmin Wang, Berkeley, CA (US)

(73) Assignee: BEIJING VOYAGER TECHNOLOGY CO., LTD., Beijing (CN)

( * ) Notice: Subject to any disclaimer, the term of this patent is extended or adjusted under 35 U.S.C. 154(b) by 343 days.

This patent is subject to a terminal disclaimer.

(21) Appl. No.: 17/554,445

(22) Filed: Dec. 17, 2021

(65) Prior Publication Data

US 2023/0184903 A1 Jun. 15, 2023

Related U.S. Application Data

(63) Continuation-in-part of application No. 17/552,946, filed on Dec. 16, 2021, which is a
(Continued)

(51) Int. Cl.
*H01L 31/18* (2006.01)
*G01S 7/481* (2006.01)
(Continued)

(52) U.S. Cl.
CPC ............ *H01L 31/18* (2013.01); *G01S 7/4816* (2013.01); *G01S 7/4817* (2013.01); *G01S 17/02* (2013.01);
(Continued)

(58) Field of Classification Search
CPC ...... G01S 7/4816; G01S 7/4817; G01S 17/02; G01S 17/42; G01S 17/89; G02B 5/005;
(Continued)

(56) References Cited

U.S. PATENT DOCUMENTS

10,670,719 B2 * 6/2020 Wang ................. G02B 27/0961
2010/0033788 A1 * 2/2010 Xie ........................ G06Q 10/06
438/106

(Continued)

*Primary Examiner* — Tarifur R Chowdhury
*Assistant Examiner* — Carlos Perez-Guzman
(74) *Attorney, Agent, or Firm* — BAYES PLLC (57) ABSTRACT

Embodiments of the disclosure include a receiver of an optical sensing system. The receiver may include a mask configured to resonate during a scanning procedure performed by the optical sensing system. The receiver may also include a photodetector array positioned on a first side of the mask. The photodetector array may be configured to detect light that passes through the mask during the scanning procedure to generate a frame. The receiver may further include a light collector array aligned with the photodetector
(Continued)

array and configured to concentrate the light that passes through the mask during the scanning procedure before directing the light to the photodetector array.

20 Claims, 9 Drawing Sheets

Related U.S. Application Data continuation-in-part of application No. 17/552,223, filed on Dec. 15, 2021, now Pat. No. 11,906,358.

(51) Int. Cl.
*G01S 17/02* (2020.01)
*G02B 5/00* (2006.01)
*G02B 19/00* (2006.01)
*G02B 26/10* (2006.01)

(52) U.S. Cl.
CPC ......... *G02B 5/005* (2013.01); *G02B 19/0019* (2013.01); *G02B 19/0076* (2013.01); *G02B 26/105* (2013.01)

(58) Field of Classification Search
CPC ............ G02B 19/0019; G02B 19/0076; G02B 26/10; G02B 27/0988
See application file for complete search history.

(56) References Cited

U.S. PATENT DOCUMENTS

| | | | |
|---|---|---|---|
| 2013/0113921 A1* | 5/2013 | Richards | H04N 25/48 348/135 |
| 2020/0209615 A1* | 7/2020 | Lee | B81C 1/00404 |
| 2022/0307903 A1* | 9/2022 | Zhou | G01J 3/0208 |

* cited by examiner

RECEIVER WITH A LIGHT COLLECTOR ARRAY AND A MASK FOR IMPROVING DETECTION RESOLUTION DURING A SCANNING PROCEDURE OF AN OPTICAL SENSING SYSTEM

CROSS-REFERENCE TO RELATED APPLICATION(S)

This application is a continuation-in-part of U.S. application Ser. No. 17/552,223, entitled "A RECEIVER WITH A HADAMARD MASK FOR IMPROVING DETECTION RESOLUTION DURING A SCANNING PROCEDURE OF AN OPTICAL SENSING SYSTEM" and filed on Dec. 15, 2021, which is expressly incorporated by reference herein in its entirety. This application is also a continuation-in-part of U.S. application Ser. No. 17/552,946, entitled "A HADAMARD MASK FOR IMPROVING DETECTION RESOLUTION DURING A SCANNING PROCEDURE OF AN OPTICAL SENSING SYSTEM" and filed on Dec. 16, 2021, which is expressly incorporated by reference herein in its entirety.

TECHNICAL FIELD

The present disclosure relates to a receiver for an optical sensing system, and more particularly to, a receiver that uses a sub-pixelization mask and a light collector array configured to concentrate light passing through the mask in front of a photodetector array.

BACKGROUND

Optical sensing systems, e.g., such as LiDAR systems, have been widely used in advanced navigation technologies, such as to aid autonomous driving or to generate high-definition maps. For example, a typical LiDAR system measures the distance to a target by illuminating the target with pulsed laser light beams that are steered towards an object in the far field using a scanning mirror, and then measuring the reflected pulses with a sensor. Differences in laser light return times, wavelengths, and/or phases (also referred to as "time-of-flight (ToF) measurements") can then be used to construct digital three-dimensional (3D) representations of the target. Because using a narrow laser beam as the incident light can map physical features with very high resolution, a LiDAR system is particularly suitable for applications such as sensing in autonomous driving and high-definition map surveys.

Earlier generations of optical sensing systems included electromechanical systems that were mounted on bases, which rotate mechanically to emit laser light in 360 degrees. In such systems, the optical sensor rotates to sense the surrounding area. These moving parts are manufactured with a high degree of precision to ensure measurements are obtained with a degree of accuracy suitable for autonomous navigation. Achieving this high level of precision is expensive and time consuming. For example, to achieve a desired detection resolution, the moving parts have to include large arrays of laser emitters and detectors. The large number of emitters and detectors do not only increase the size of the moving parts, making manufacture and assembly challenging, the arrays also need to be precisely aligned to achieve the necessary detection accuracy. In addition, moving parts may make the optical sensor less resilient to vibrations. Driving in rough terrain, for example, may negatively impact ToF measurements.

To overcome some of the problems of electromechanical systems, solid-state optical sensing systems and/or semi-solid-state optical sensing systems have been introduced with fewer moving parts. A solid-state system has two scanning axis, at least one of which is a solid-state axis implemented by a solid-state scanner, such as a MEMS scanning mirror or mirror array. The solid-state optical sensing system typically uses a one-dimensional (1D) laser array as the laser source (e.g., such as an edge emitting laser bar with a plurality of emitters) and a 1D photodetector array. By using the rotating scanners, the laser emitter array and the photodetector array can be stationary and not part of the moving parts. While reducing the number of moving parts, conventional solid-state systems still face numerous challenges. One such challenge relates to the size of the laser array and photodetector array used in such systems. For example, to achieve a pixel number suitable for the resolution requirement of autonomous navigation, the size of the laser array and photodetector array used in such systems must be quite large. As a result, the pre-alignment issue persists and the manufacturing cost remains prohibitive. Moreover, solid-state photodetectors, such as single-photon avalanche diode (SPADs), avalanche photodiodes (APDs), and other types of semiconductor photodetectors, suffer from low light detection efficiency due to the low fill factor of the sensitive regions as compared with the overall surface area of the semiconductor substrate on which they are formed. Consequently, to achieve a light detection efficiency suitable for autonomous navigation, the photodetectors of conventional solid-state systems must be quite large for this reason as well.

Thus, there is a need for a semi-solid-state optical sensing system that achieves the resolution requirement for autonomous-driving applications, while at the same time reducing the size of photodetector array and increasing its light detection efficiency, as compared to known systems.

SUMMARY

Embodiments of the disclosure provide a receiver of an optical sensing system. The receiver may include a mask configured to resonate during a scanning procedure performed by the optical sensing system. The receiver may also include a photodetector array positioned on a first side of the mask. The photodetector array may be configured to detect light that passes through the mask during the scanning procedure to generate a frame. The receiver may further include a light collector array aligned with the photodetector array and configured to concentrate the light that passes through the mask during the scanning procedure before directing the light to the photodetector array.

Embodiments of the disclosure may further provide a method of forming a light collector array for an optical sensing system. The method may include forming a plurality of light collectors. Each light collector of the plurality of light collectors may be formed by forming a first mold of the light collector and forming a second mold of the light collector based at least in part on the first mold. Each light collector may be further formed by filling the second mold of the light collector with a base material, curing the base material to form the light collector in the second mold, and releasing the light collector from the second mold. Each light collector may also be formed by applying a reflective material to a surface of the light collector. Each light collector may include a two-dimensional collector or a three-dimensional collector. The method may further include arranging the plurality of light collectors into the light collector array.

Embodiments of the disclosure may also provide an optical sensing system. The optical sensing system may include a transmitter configured to emit light towards an environment during a scanning procedure. The optical sensing system may also include a receiver. The receiver may include a mask configured to resonate during a scanning procedure performed by the optical sensing system. The receiver may also include a photodetector array positioned on a first side of the mask. The photodetector array may be configured to detect light that passes through the mask during the scanning procedure to generate a frame. The receiver may also include a light collector array aligned with the photodetector array and configured to concentrate the light that passes through the mask during the scanning procedure before directing the light to the photodetector array.

It is to be understood that both the foregoing general description and the following detailed description are exemplary and explanatory only and are not restrictive of the invention, as claimed.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

LiDAR is an optical sensing technology that enables autonomous vehicles to "see" the surrounding world, creating a virtual model of the environment to facilitate decision-making and navigation. An optical sensor (e.g., LiDAR transmitter and receiver) creates a 3D map of the surrounding environment using laser beams and time-of-flight (ToF) distance measurements. ToF, which is one of LiDAR's operational principles, provides distance information by measuring the travel time of a collimated laser beam to reflect off an object and return to the sensor. Reflected light signals are measured and processed at the vehicle to detect, identify, and decide how to interact with or avoid objects.

Due to the challenges imposed by the prohibitive size of a photodetector array that achieves a desired detection resolution and light detection efficiency in conventional solid-state optical sensing systems, as discussed in the BACKGROUND section above, the present disclosure provides a Hadamard mask configured to resonate during a scanning procedure to provide sub-pixelization of a frame captured using a photodetector array of reduced size and a light collector array configured to concentrate light that passes through the Hadamard mask before it impinges on the photodetector array. The Hadamard mask may include, e.g., a frame beginning pattern corresponding to a start of a frame captured during the scanning procedure and a coded pattern including multiple rows of coded regions arranged in a grid configured to provide sub-pixelization of the frame. More specifically, the Hadamard mask of the present disclosure is configured to resonate in front of the photodetector array to align each of its rows with the photodetector array in a sequential manner. The photodetector array may be configured to sequentially detect light passing through a slit apparatus (e.g., located between the Hadamard mask and the far field environment) and impinging on each of the plurality of rows of the Hadamard mask grid individually. Each photodetector in the photodetector array may have an associated light collector in the light collector array such that light is concentrated before each photodetector, which enables a receiver of the present disclosure to use a photodetector array of reduced size but with increased light efficiency, as compared to known approaches.

Moreover, due to the challenges associated with forming a light collector with an accurate shape using known methods, e.g., such as wet-etching, the present disclosure provides a molding technique that begins with forming a mold of the light collector(s) using a reductive (e.g., computer numerical control (CNC)) or additive (e.g., three-dimensional (3D) printing) technique that removes layers from or adds layers to a substrate material based on design specifications of a digital file, which enhances the accuracy of the shape of the final product, as compared with known approaches. Once the first mold has been formed, a polymer layer may be formed over the first mold. After curing, the polymer layer forms a reverse mold of the light collector shape. The reverse mold may then be filled with another polymer that is optically clear and is made solid by exposure to ultraviolet (UV) light. A reflective material may then be formed on an outer wall of each three-dimensional light collector in the array to collect light that is directed towards the photodetector. Alternatively, when the light collector shape is a two-dimensional trough, a reflective coating may be formed on either the inner surface of the trough or an outer surface of the trough, the later so long as the polymer that forms the body of the trough is transparent. Using these technique, the accuracy of the shape of each light collector may be increased as compared to known techniques, which enhances the light concentrating efficiency of the light collector, and hence, the light detection efficiency of the photodetector.

Some exemplary embodiments are described below with reference to a receiver used in LiDAR system(s), but the application of the emitter array disclosed by the present disclosure is not limited to the LiDAR system. Rather, one of ordinary skill would understand that the following description, embodiments, and techniques may apply to any type of optical sensing system (e.g., biomedical imaging, 3D scanning, tracking and targeting, free-space optical communications (FSOC), and telecommunications, just to name a few) known in the art without departing from the scope of the present disclosure.

Figure 1:
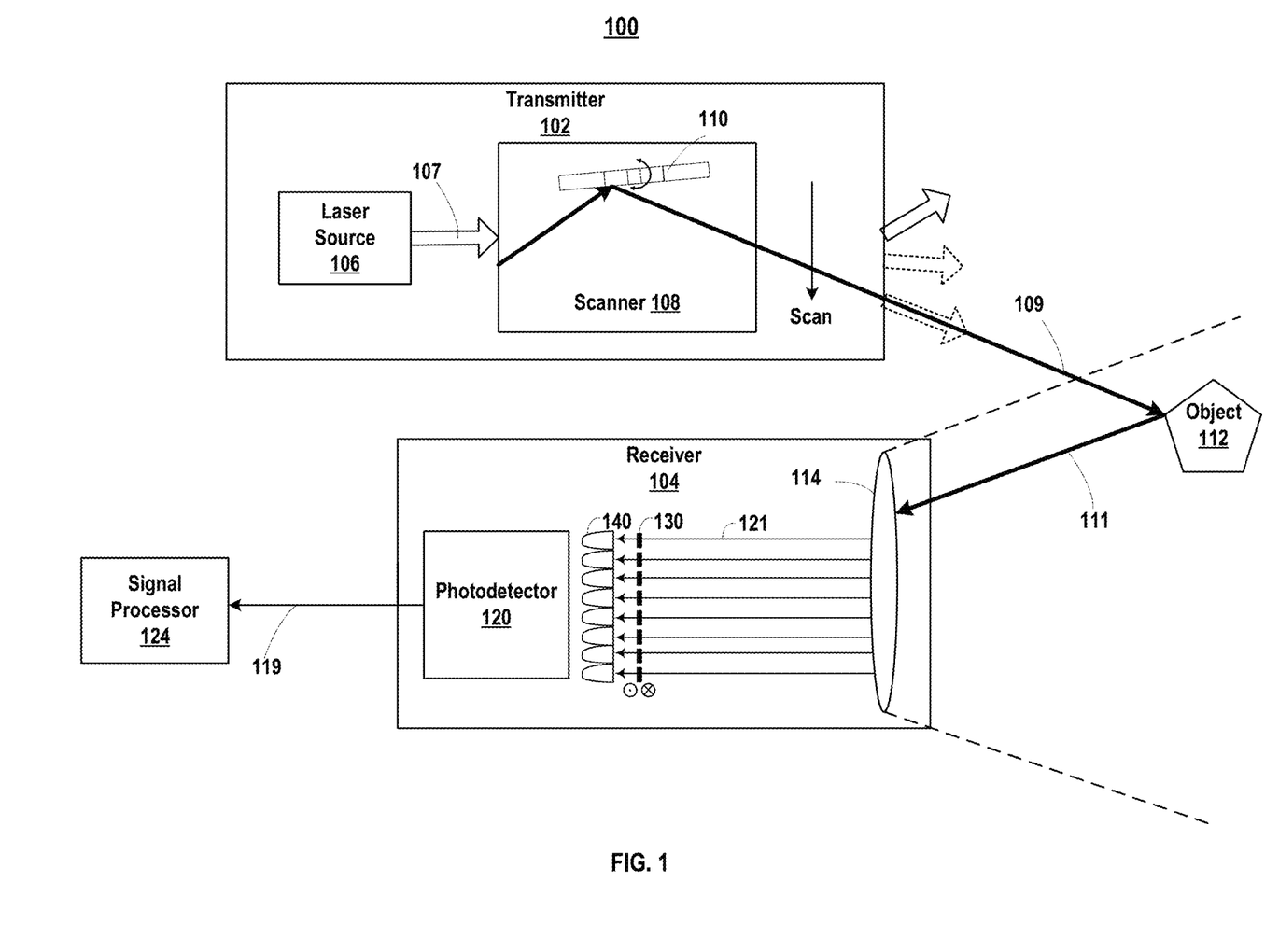
FIG. 1 illustrates a block diagram of an exemplary LiDAR system, according to embodiments of the disclosure.

FIG. 1 illustrates a block diagram of an exemplary LiDAR system 100, according to embodiments of the disclosure. LiDAR system 100 may include a transmitter 102 and a receiver 104. Transmitter 102 may emit laser beams along multiple directions. Transmitter 102 may include one or more laser sources 106 and a scanner 108.

Transmitter 102 can sequentially emit a stream of pulsed laser beams in different directions within a scan range (e.g., a range of scanning angles in angular degrees), as illustrated in FIG. 1. Laser source 106 may be configured to provide a laser beam 107 (also referred to as "native laser beam") to scanner 108. In some embodiments of the present disclosure, laser source 106 may generate a pulsed laser beam in the UV, visible, or near infrared wavelength range. Laser beam 107 may diverge in the space between the laser source 106 and the scanner 108. Thus, although not illustrated, transmitter 102 may further include a collimating lens located between laser source 106 and scanner 108 and configured to collimate divergent laser beam 107 before it impinges on scanner 108.

In some embodiments of the present disclosure, laser source 106 may include a pulsed laser diode (PLD), a vertical-cavity surface-emitting laser (VCSEL), a fiber laser, etc. For example, a PLD may be a semiconductor device similar to a light-emitting diode (LED) in which the laser beam is created at the diode's junction. In some embodiments of the present disclosure, a PLD includes a PIN diode in which the active region is in the intrinsic (I) region, and the carriers (electrons and holes) are pumped into the active region from the N and P regions, respectively. Depending on the semiconductor materials, the wavelength of incident laser beam 107 provided by a PLD may be greater than 700 nm, such as 760 nm, 785 nm, 808 nm, 848 nm, 905 nm, 940 nm, 980 nm, 1064 nm, 1083 nm, 1310 nm, 1370 nm, 1480 nm, 1512 nm, 1550 nm, 1625 nm, 1654 nm, 1877 nm, 1940 nm, 2000 nm, etc. It is understood that any suitable laser source may be used as laser source 106 for emitting laser beam 107.

Scanner 108 may be configured to steer a laser beam 109 towards an object 112 (e.g., stationary objects, moving objects, people, animals, trees, fallen branches, debris, metallic objects, non-metallic objects, rocks, rain, chemical compounds, aerosols, clouds and even single molecules, just to name a few) in a direction within a range of scanning angles. In some embodiments consistent with the present disclosure, scanner 108 may include a micromachined mirror assembly (also referred to herein as "scanning mirror assembly") that is comprised of a plurality of elements. One such element is a scanning mirror, such as a MEMS mirror 110 illustrated in FIG. 1. Although not shown in FIG. 1, the scanning mirror assembly of scanner 108 may also include various other elements. For example, these other elements may include, without limitation, a MEMS actuator, actuator anchor(s), a plurality of interconnects, scanning mirror anchor(s), just to name a few.

In some embodiments, receiver 104 may be configured to detect a returned laser beam 111 returned from object 112. Returned laser beam 111 may be returned from object 112 and have the same wavelength as laser beam 109. Returned laser beam 111 may be in a different direction from laser beam 109. Receiver 104 can collect laser beams returned from object 112 and output electrical signals reflecting the intensity of the returned laser beams. Upon contact, laser beam 109 can be reflected by object 112 via backscattering, e.g., such as Raman scattering and/or fluorescence.

Figure 2A:
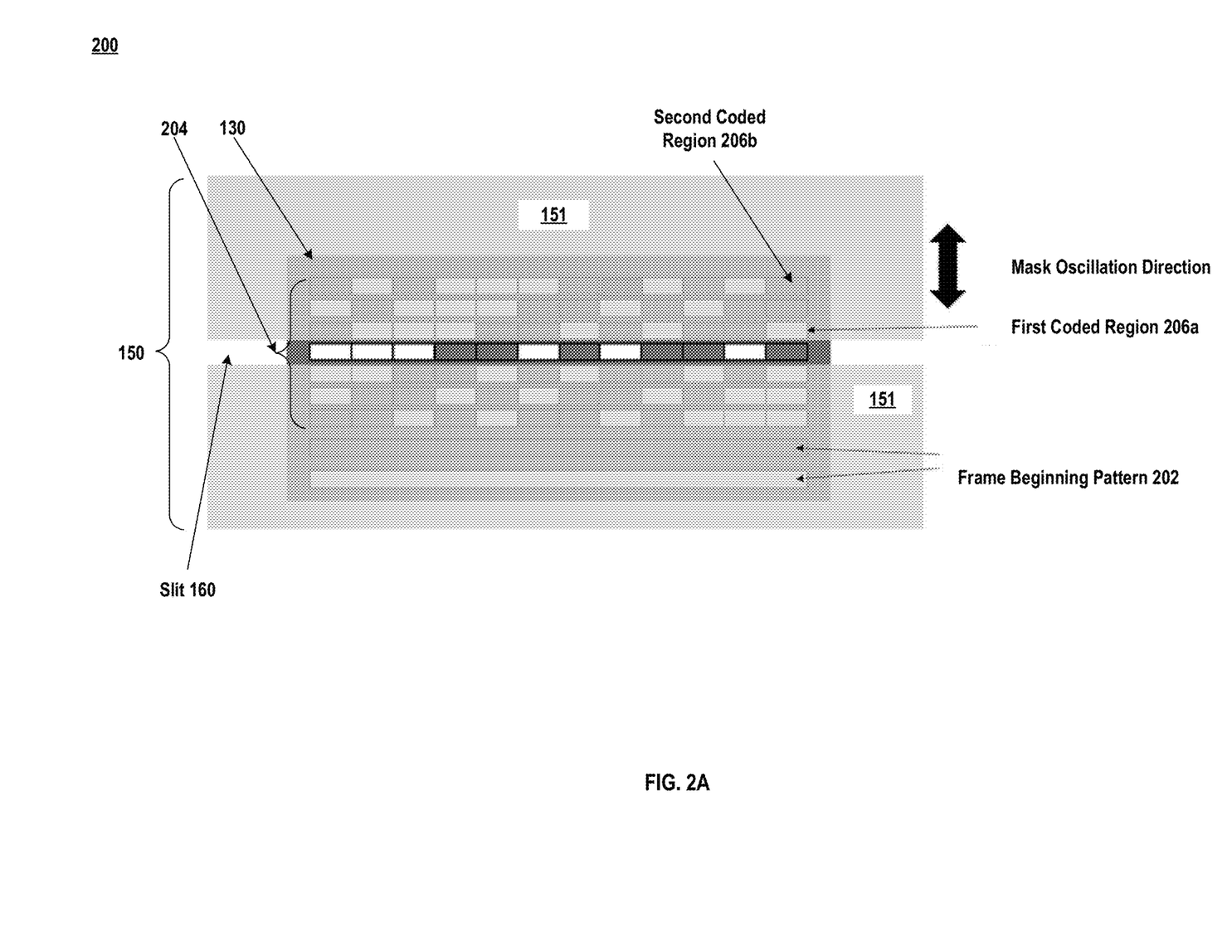
FIG. 2A illustrates a detailed view of an exemplary Hadamard mask and slit apparatus, according to embodiments of the disclosure.

As illustrated in FIG. 1, receiver 104 may receive the returned laser beam 111. Receiver 104 may include, among others, a lens 114, a slit apparatus (e.g., such as slit apparatus 150 depicted in FIG. 2A), a Hadamard mask 130, a light collector array 140, and a photodetector array 120. Lens 114 may be configured to collect light from a respective direction in its FOV and converge the laser beam 121 to focus before it is received on the slit apparatus. The slit apparatus may include opaque regions (as shown in FIG. 2A) that block light passage and a slit (also as shown in FIG. 2A) or transparent region that enables light passage through to Hadamard mask 130.

Figure 2B:
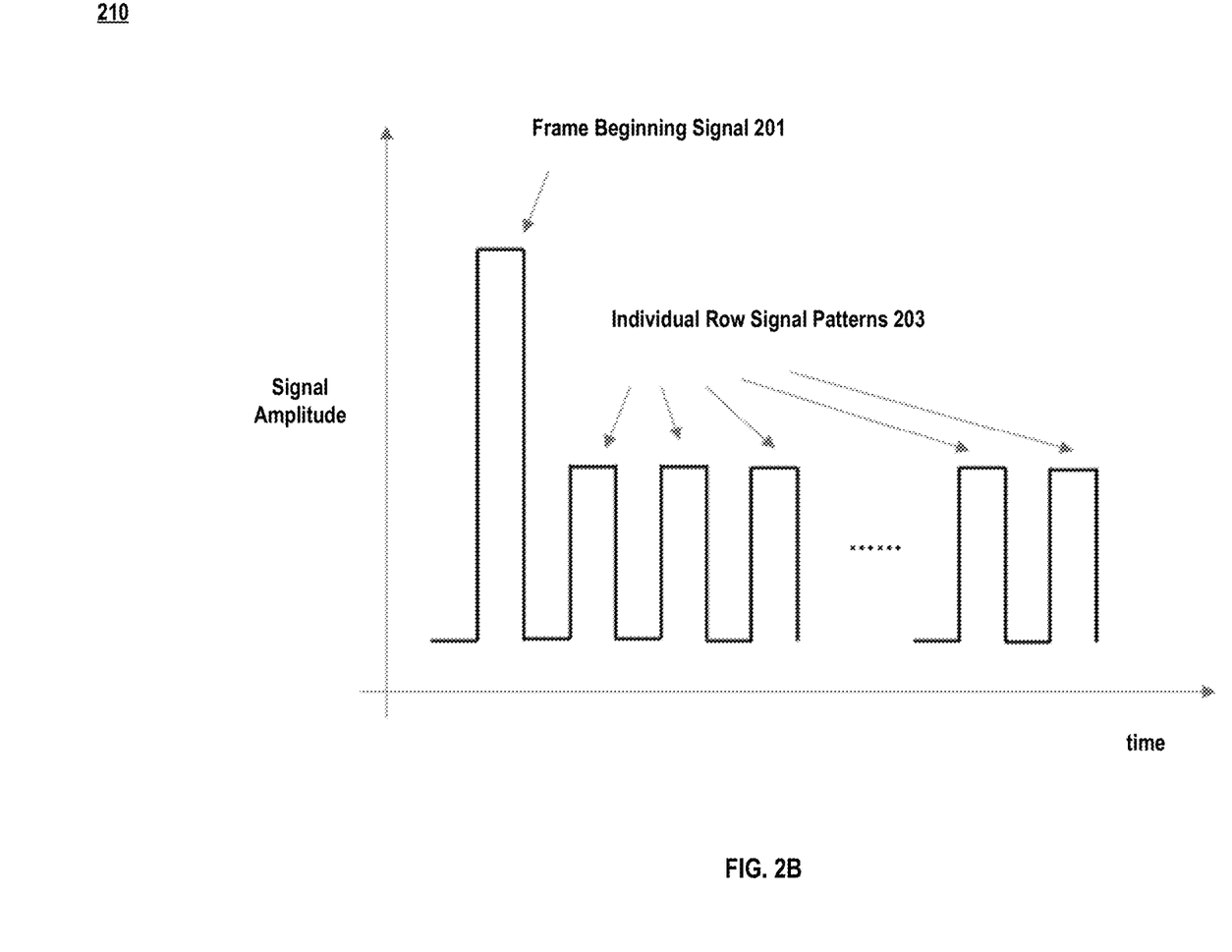
FIG. 2B illustrates a graphical representation of a timing sequence of an exemplary Hadamard mask based scanning procedure, according to embodiments of the disclosure.
Figure 2C:
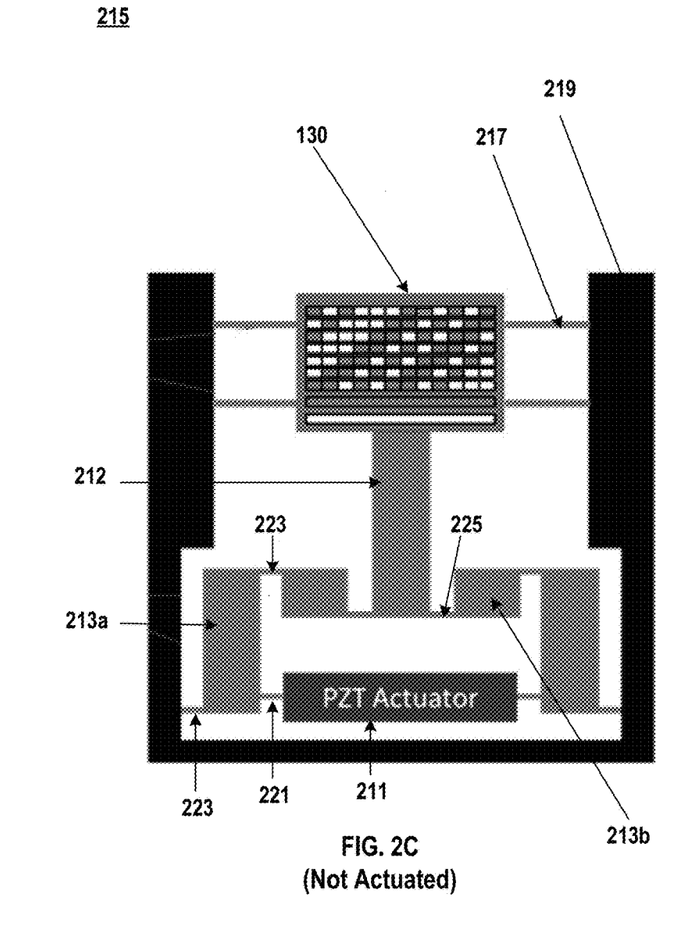
FIG. 2C illustrates a first detailed view of an exemplary Hadamard mask and a corresponding actuator without an applied displacement force, according to embodiments of the disclosure.
Figure 2D:
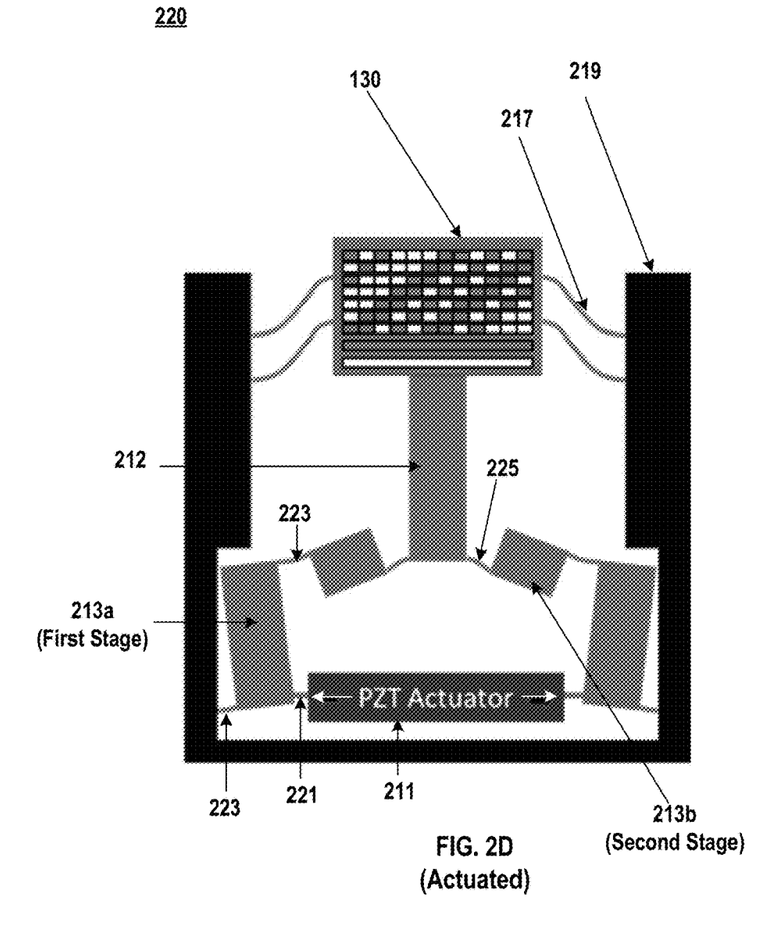
FIG. 2D illustrates a second detailed view of an exemplary Hadamard mask and a corresponding actuator with an applied displacement force, according to embodiments of the disclosure.

Hadamard mask 130 may include a frame beginning pattern configured to indicate the start of scan associated with a new frame. In certain implementations, the start of the scan may be associated with a new scanning angle of the scanning procedure. Moreover, Hadamard mask 130 may include a coded pattern comprised of a plurality of coded regions arranged in a plurality of rows and/or a grid, as shown in FIGS. 2A, 2C, and 2D. Each of the plurality of rows may include N number of coded regions, where each coded region is designed to either pass or block the light. The transparent and opaque regions (also referred to as "mask elements") all have an equal or substantially equal size and are distributed in a pre-determined pattern, which is placed on a regular grid that includes a plurality of rows of coded regions as illustrated in FIG. 2A. The width of the slit in the slit apparatus may be the same or similar as a single row of Hadamard mask 130 such that at each point in time light impinges on a single row of the mask during the line-scanning procedure. In the example illustrated in FIG. 1, Hadamard mask 130 may resonate in and out of the plane of the page by the application of a displacement force caused by an actuator (e.g., such as actuator 211 depicted in FIGS. 2C and 2D) coupled to Hadamard mask 130.

During the line-scan, returned laser beam 111 may be collected by lens 114 as laser beam 121, which passes through the slit of the slit apparatus. The light passing through the slit impinges on only the row of the Hadamard mask 130 that is aligned with the slit at that point in time. The beam size of the incoming light passing through Hadamard mask 130 may be larger than the sensitive area of the photodetector array 120. Thus, receiver 104 may include a light collector array 140 with multiple light collectors (e.g., each light collector can be a V-shape collector, a compound parabolic collector (CPC), a conical collector, etc.), which may be configured to enhance the light collection efficiency in front of photodetector array 120. A light collector is a non-imaging concentrator, which may be capable of collecting all or much of the available radiation (both beam and diffuse) that impinges on the light collector in a wide range of angles of incidence and directing it to photodetector array 120. V-shape collectors and CPCs are representatives of these type of non-imaging concentrators. V-shape collectors and CPCs do not have strict requirements for the angle of incidence as in other types of collectors of different trough shapes (e.g., two-dimensional (2D) shapes) and/or solid bodies (e.g., 3D shapes), which makes V-shape collectors and/or CPCs attractive from the point of view of system simplicity and flexibility. Light collector array 140 can be implemented as an array of 2D concentrators (also referred to as "troughs") or 3D concentrators (e.g., pyramids, CPC, parabocylinders, cones, etc.). When formed as a 3D concentrator, an optically clear material (e.g., such as glass or a polymer) may be used to form the light collector array. A reflective coating may be formed on an inner wall (also referred to as "inner side surface") or an exterior wall (also referred to as an "exterior side surface") of the trough. The reflective coating may be formed on the exterior wall of the trough so long as the material used to form the body of the trough is transparent. Moreover, when configured as a 3D light collector, the reflective coating may be formed on the exterior side surface thereof but not on the flat ends to enable the passage and collection of light therein. The reflective surface "traps" light within the trough or 3D concentrator such that light reflects back and forth off of the reflective surface until it is eventually directed outward towards photodetector array 120, e.g., as shown in FIGS. 2F and 2G.

Photodetector array 120 may have a spatial resolution sufficiently matched to the grid size of Hadamard mask 130. Photons from laser beam 121 that pass through the transparent coded regions of Hadamard mask 130 project onto photodetector array 120. Due to the slit apparatus, a single row of the coded pattern may be projected on photodetector array 120 at any given time. In other words, the light received by photodetector array 120 at a particular time is coded by the pattern of Hadamard mask 130 that is aligned with the slit at that time. As Hadamard mask 130 resonates and shifts in space, the encoded pattern aligned with the slit changes over time, therefore changing the encoding of the received light at photodetector array 120. For each frame, photodetector array 120 may receive multiple lines of light signals corresponding to the rows of encoded patterns on Hadamard mask 130 during a line-scanning procedure. After a certain illumination period (e.g., when each of the rows have been scanned for a particular frame), the received lines of light signals may be decoded to generate an image of the far field environment by the signal processor 124. Signal processor 124 may decode the received signals according to the known encodings on Hadamard mask 130 and its timing sequence. By encoding the received signals through Hadamard mask 130 and then decoding the signals, LiDAR system 100 may increase the sub-pixelization of the frame beyond that provided by the pixelization of photodetector array 120.

Photodetector array 120 may convert the laser beam 121 (e.g., returned laser beam 111) collected by lens 114 into an electrical signal 119 (e.g., a current or a voltage signal). Electrical signal 119 may be generated when photons are absorbed in a photodiode included in photodetector array 120. In some embodiments of the present disclosure, photodetector array 120 may include a PIN detector, a PIN detector array, an avalanche photodiode (APD) detector, a APD detector array, a single photon avalanche diode (SPAD) detector, a SPAD detector array, a silicon photo multiplier (SiPM/MPCC) detector, a SiP/MPCC detector array, or the like.

LiDAR system 100 may also include one or more signal processor 124. Signal processor 124 may receive electrical signal 119 generated by photodetector array 120. Signal processor 124 may process electrical signal 119 to determine, for example, distance information carried by electrical signal 119. Signal processor 124 may construct a point cloud based on the processed information. The point cloud may include a frame, which is an image of the far field at a particular point in time. In this context, a frame is the data/image captured of the far field environment at each scanning angle. Signal processor 124 may include a microprocessor, a microcontroller, a central processing unit (CPU), a graphical processing unit (GPU), a digital signal processor (DSP), or other suitable data processing devices. By including the slit apparatus, Hadamard mask 130, and light collector array 140 in receiver 104, the frame generated by signal processor 124 may have a larger pixel number than photodetector array 120, thereby reducing the size and cost of the present optical sensing system, e.g., as described in additional detail below in connection with FIGS. 2A, 2B, 2C, 2D, 2E, 2F, 2G, 3A, 3B, and 4.

FIG. 2A illustrates a diagram 200 of an exemplary Hadamard mask 130 and slit apparatus 150, according to embodiments of the disclosure. FIG. 2B illustrates a graphical representation 210 of a timing sequence of an exemplary Hadamard mask based scanning procedure, according to embodiments of the disclosure. FIG. 2C illustrates a first diagram 215 of an exemplary Hadamard mask and a corresponding actuator without an applied displacement force, according to embodiments of the disclosure. FIG. 2D illustrates a second diagram 220 of an exemplary Hadamard mask and a corresponding actuator with an applied displacement force, according to embodiments of the disclosure. FIGS. 2A, 2B, 2C, and 2D will be described together.

As mentioned above, receiver 104 may include a slit apparatus 150, such as the one illustrated in FIG. 2A. Slit apparatus 150 may be a fixed structure that does not oscillate during a scanning procedure and is positioned between the lens 114 and the Hadamard mask 130 illustrated in FIG. 1.

Referring to FIG. 2A, slit apparatus 150 may include a pair of opaque structures 151 configured to block the passage of light. Slit apparatus 150 may also include a slit 160 that is located between the opaque structures 151 and configured to allow the passage of light. Although shown as two structures separated by a slit, slit apparatus 150 may be any shaped structure with a hole and/or slit through which laser beam 121 can pass. Slit 160 may be an opening, a hole, or a transparent material, or any other configuration that allows light to pass unobstructed.

As seen in FIG. 2A, Hadamard mask 130 may include a frame beginning pattern 202 and a coded pattern 204. Frame beginning pattern 202 and different rows of coded pattern 204 may sequentially align with slit 160 during a line-scanning procedure by resonating Hadamard mask 130. Each of the frame beginning pattern 202 and the coded pattern 204 may include opaque regions (depicted with grey in FIGS. 2A, 2C, and 2D), which are configured to block the passage of laser beam 121. Moreover, frame beginning pattern 202 and coded pattern 204 each include transparent regions (depicted with white in FIGS. 2A, 2C, and 2D) configured to allow the passage of laser beam 121.

Depending on the desired sub-pixelization, each row of Hadamard mask 130 may be divided into X first coded regions 206a and Y second coded regions 206b, where X and Y may be the same number or different. Each of first coded regions 206a may be transparent and portions of laser beam 121 that pass through slit 160 may also pass through these first coded regions 206a. On the other hand, second coded regions 206b may be opaque and configured to block the passage of laser beam 121 during the line-scanning procedure. In certain implementations, there may be N rows in coded pattern 204 to provide sufficient information collection at photodetector array 120 and signal processor 124. In certain implementations, the N rows may be equal in number to one or more of the X first coded regions 206a and/or the Y second coded regions 206b. In certain other implementations, the N rows may be different in number than one or more of the X first coded regions 206a and/or the Y second coded regions 206b.

By scanning through each of the rows in Hadamard mask 130, different parts of laser beam 121 containing different information about the far field may then impinge upon photodetector array 120. Using line-scanning of Hadamard mask 130, a larger amount of information can be collected using a photodetector array 120 of a reduced size. For example, using Hadamard mask 130 and a line-scanning procedure to implement sub-pixelization, the size of photodetector array 120 may be reduced by N fold, as compared with known systems. The line-scanning procedure is described below.

For example, scanner 108 of FIG. 1 steers laser beam 109 at a particular scanning angle (associated with an individual frame) towards object 112. Then, reflected laser beam 111 is collected by lens 114 into collimated laser beam 121 that passes through slit 160 of slit apparatus 150 and impinges on Hadamard mask 130. At the beginning of a scanning procedure for a new frame, frame beginning pattern 202 is aligned with slit 160 such that laser beam 121 passes through its transparent region and impinges on photodetector array 120. An electrical signal proportional to the number of photons impinging on photodetector array 120 is sent to signal processor 124. Then, Hadamard mask 130 oscillates downward and laser beam 121 impinges on each row of coded pattern 204 sequentially.

Frame beginning pattern 202 may be integrated into Hadamard mask 130 such that the start signal 201 (depicted in FIG. 2B) of each frame can be identified based on the signal amplitude. In some embodiments, frame beginning pattern 202 may include a larger transparent region than the collective size of first coded regions 206a in any row in coded pattern 204 to allow a distinguishable amount of light to pass through. Accordingly, signal processor 124 shown in FIG. 1 may identify the start of a new frame when the received signal has the highest amplitude (e.g., start signal 201). As illustrated in FIG. 2B, the amplitude of start signal 201 is larger than the amplitude of the any individual signal of signal pattern 203, where each individual signal is associated with one of the rows in coded pattern 204. Because the transparent region(s) of frame beginning pattern 202 allows the largest number of photons from laser beam 121 to pass therethrough, the signal amplitude of start signal 201 is distinguishable from those signals in signal pattern 203, where each signal in signal pattern 203 is associated with one row in coded pattern 204.

By forming a frame beginning pattern 202 in Hadamard mask 130, signal processor 124 may identify the beginning of a new frame when the signal amplitude meets a threshold level associated with the start of a new frame. Identifying a new frame based on a signal amplitude may reduce the time and computational resources used by signal processor 124 to identify the start of a new frame in the line-scanning procedure, as compared to using a Hadamard mask without frame beginning pattern 202.

Then, as Hadamard mask 130 resonates, it is shifted downward row-by-row such that each row of coded pattern 204 receives laser beam 121 sequentially, and photodetector array 120 may output an individual signal of signal pattern 203 containing image/data of the far field environment as encoded by the corresponding row of coded pattern 204. Once each of the rows of coded pattern 204 has been scanned (e.g., once laser beam 121 has impinged on each of the rows), scanner 108 may select the next scanning angle and adjust MEMS mirror 110 such that laser beam 109 is directed toward object 112 at the new scanning angle. While at the same time, Hadamard mask 130 oscillates downward such that the frame beginning pattern 202 is re-aligned with slit 160 of slit apparatus 150 for the start of the new frame. The line-scanning procedure then continues in the same or similar manner as described above for the previous frame. The mechanism by which Hadamard mask 130 is made to oscillate will be described below in connection with FIGS. 2C and 2D.

Referring to FIGS. 2C and 2D, Hadamard mask 130 may be coupled to a fixed structure 219 using one or more torsion springs 217. Fixed structure 219 may be coupled to a substrate or another structure of receiver 104. Hadamard mask 130 may be caused to oscillate/resonate using an actuator 211 that is coupled to a series of displacement amplifiers 213 (also referred to as "mechanical amplifiers"), which are also coupled to handle 221. Displacement amplifiers 213 provide a linkage mechanisms that amplify the magnitude of the displacement force generated by actuator 211. In the example illustrated in FIGS. 2C and 2D, actuator 211 is a piezoelectric amplifier formed from a piezoelectric material, e.g., such as lead zirconium titanate (PZT). When a voltage is applied to the PZT, actuator 211 deforms, and thus, generates the displacement force. One advantage of using a piezoelectric actuator 211, as compared to electronic and hydraulic type actuators, is the fast response, large generation pressure, and highly accurate operation resonance. While PZT can generate enough power to drive Hadamard mask 130 over a long range, the amount of expansion on PZT itself is not particularly large. Hence, by including several stages of displacement amplifiers 213, the displacement force applied to Hadamard mask 130 may be amplified such that it may perform the oscillation function described above in connection to the line-scanning procedure. However, it is contemplated that actuator 211 is not limited to the PZT actuator illustrated in FIGS. 2C and 2D. Instead, actuator 211 may be any type of actuator that causes Hadamard mask 130 to resonate during a scanning procedure without departing from the scope of the present disclosure.

Figure 2E:
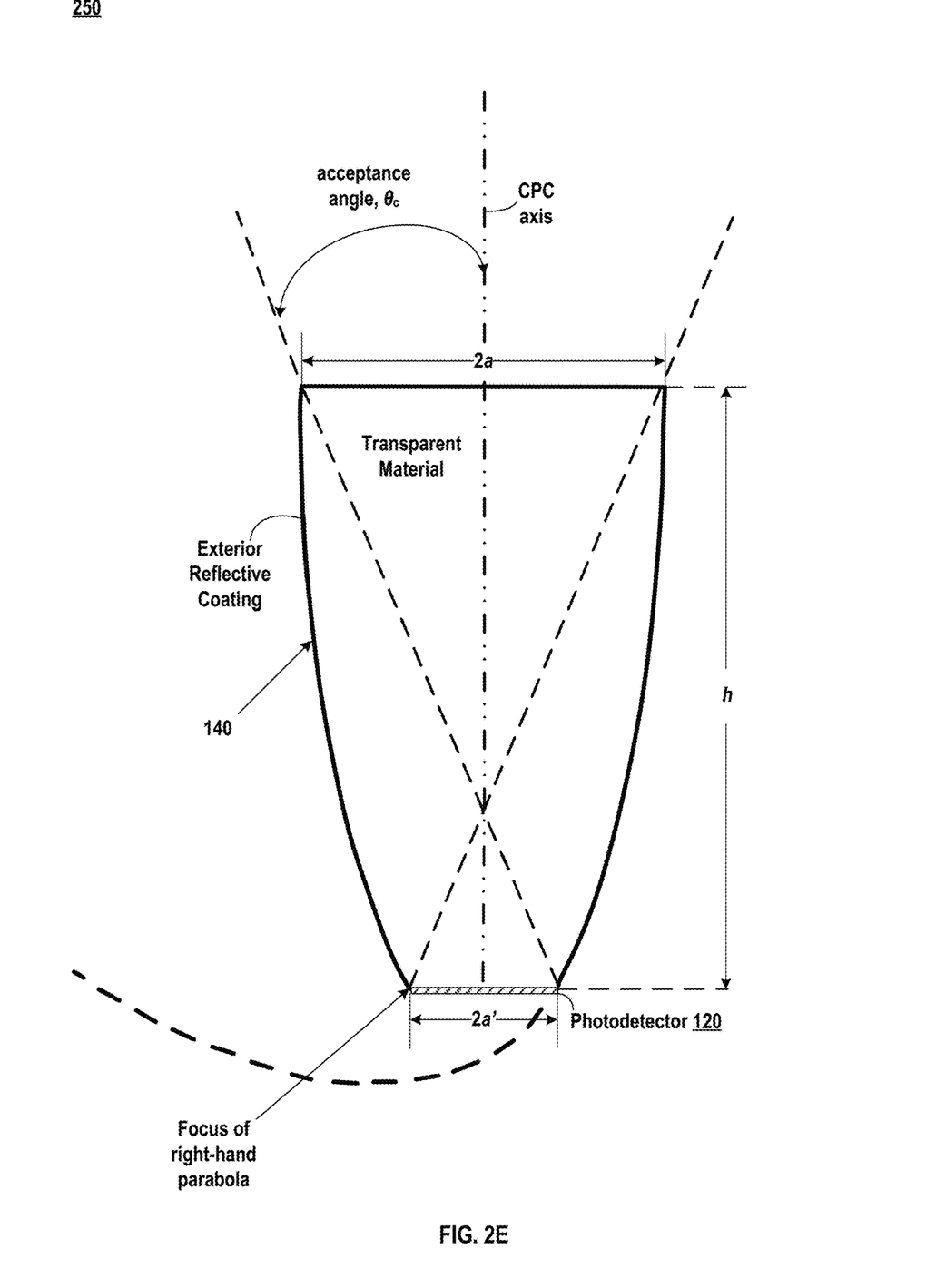
FIG. 2E illustrates a cross-sectional view of a compound parabolic concentrator (CPC), according to embodiments of the present disclosure.
Figure 2F:
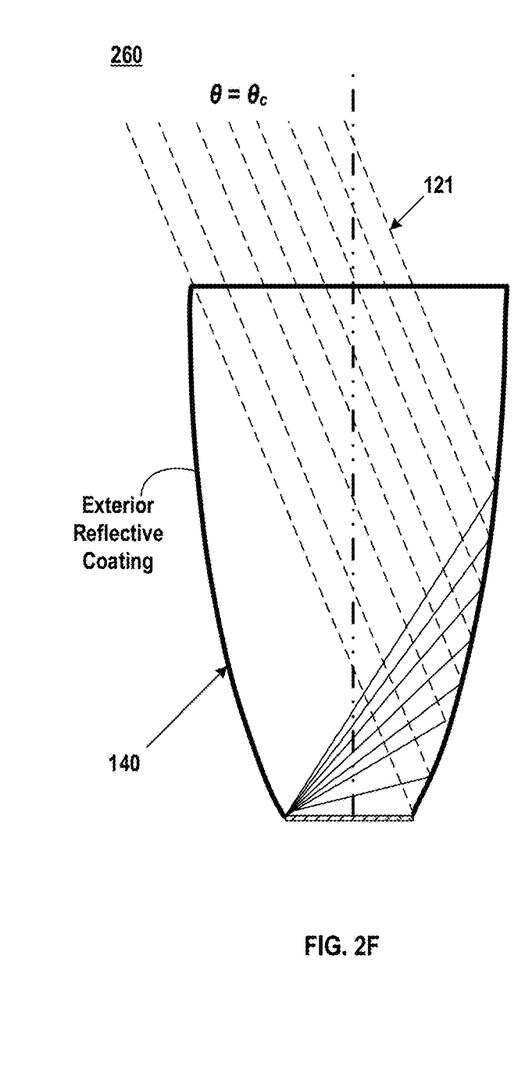
FIG. 2F illustrates the reflection of light within a CPC when the angle of incidence is equal to the acceptance angle of the CPC, according to embodiments of the present disclosure.
Figure 2G:
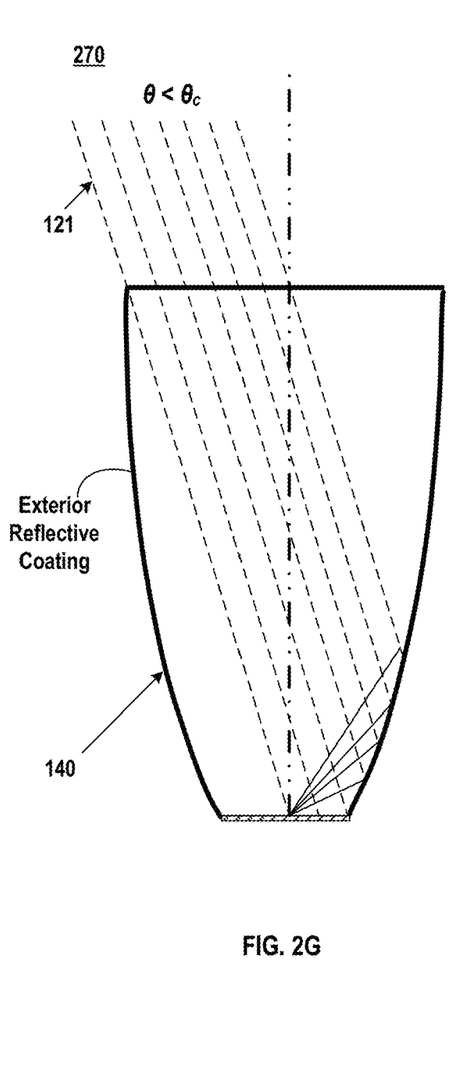
FIG. 2G illustrates the reflection of light within a CPC when the angle of incidence is smaller than the acceptance angle of the CPC, according to embodiments of the present disclosure.
Figure 2H:
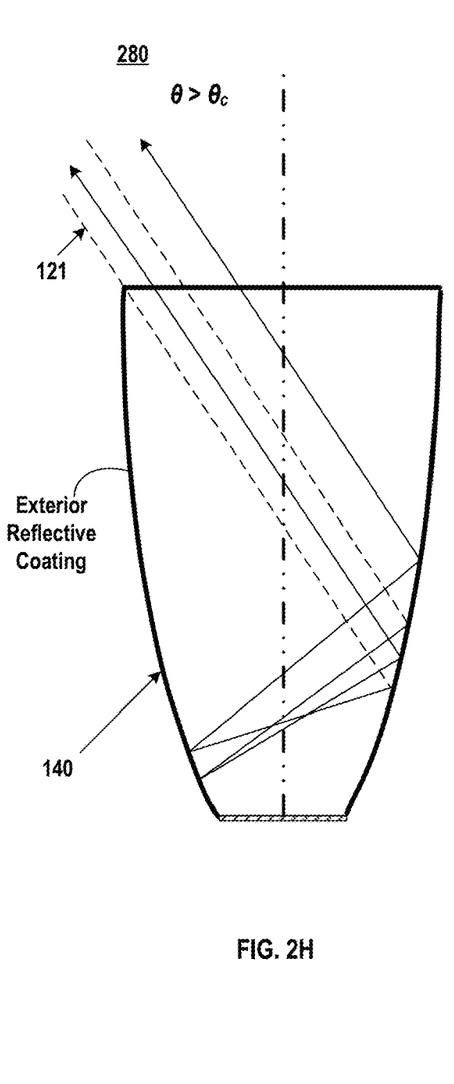
FIG. 2H illustrates the reflection of light within a CPC when the angle of incidence is larger than the acceptance angle of the CPC, according to embodiments of the present disclosure.

FIG. 2E illustrates a cross-sectional view of a three-dimensional compound parabolic concentrator (CPC) 250, according to embodiments of the present disclosure. FIG. 2F depicts a first diagram 260 of the reflection of light entering a CPC with an angle of incidence equal to the acceptance angle of the CPC, according to embodiments of the present disclosure. FIG. 2G depicts a second diagram 270 of the reflection of light entering a CPC with an angle of incidence less than the acceptance angle of the CPC, according to embodiments of the present disclosure. FIG. 2H depicts a third diagram 280 of the reflection of light entering a CPC with an angle of incidence greater than the acceptance angle of the CPC, according to embodiments of the present disclosure. FIGS. 2E-2H will be described together.

Referring to FIG. 2E, although the geometry is illustrated for a three-dimensional CPC 250, the same geometry applies to a CPC trough. CPC 250 of FIG. 2E depicts a single CPC of the plurality of CPCs in light collector array 140 of FIG. 1. CPC 250 may be formed of a transparent material (also referred to as "optically clear") with a reflective coating on the curved exterior side surface thereof. CPC 250 may be formed, for example, using the exemplary process flow described below in connection with FIGS. 3A, 3B, and 4. As illustrated in FIG. 2E, CPC 250 has an input aperture and an output aperture with respective diameters of 2a and 2a'. Moreover, the right-hand side and left-hand side of CPC 250 each form the shape of a parabola, with each parabola having a focus at the lower edge of the other parabola. Moreover, each parabola axis is tilted relative to the CPC axis to form the CPC shape.

Reflective coating is not formed on the input aperture and the output aperture of a three-dimensional CPC 250 such that light (e.g., laser beam 121) can enter and exit, respectively, through the exposed transparent material at either end of the CPC 250. Light that enters the input aperture may reflect back and forth through the transparent material of the CPC 250 and off of the reflective coating formed on the curved exterior side surface thereof, until it is eventually directed out of the output aperture to photodetector 120, as depicted in FIGS. 2F-2H.

One of the key parameters relating to the light collection is the acceptance angle $\theta_c$, CPC 250. The acceptance angle $\theta_c$, is the angle between the CPC axis and the line connecting the focus of one of the parabolas with the opposite edge of the upper aperture. Referring to FIGS. 2E, 2F, and 2G, CPC 250 is designed such that each laser beam 121 entering the upper aperture of CPC 250 at an angle less than or equal to $\theta_c$ reaches photodetector 120. However, as shown in FIG. 2H, when the angle at which laser beam 121 enters the upper aperture is greater than $\theta_c$, the laser beam 121 will return to exit the upper aperture. The relationship between the input diameter 2a, the output diameter 2a', and the acceptance angle $\theta_c$, can be expressed using Equation (1):

$$2a' = (2a)\sin\theta_c \quad (1).$$

The light concentration performance of CPC 250 can be expressed as the geometric concentration ratio $C_{geo}$ shown below in Equation (2):

$$C_{geo} = \frac{2a}{2a'} = \frac{1}{\sin\theta_c}. \quad (2)$$

Using Equations (1) and (2), one can optimize the design of CPC 250 such that a tradeoff between the desired light concentration performance and overall size of the light collector array can be achieved.

Figure 3A:
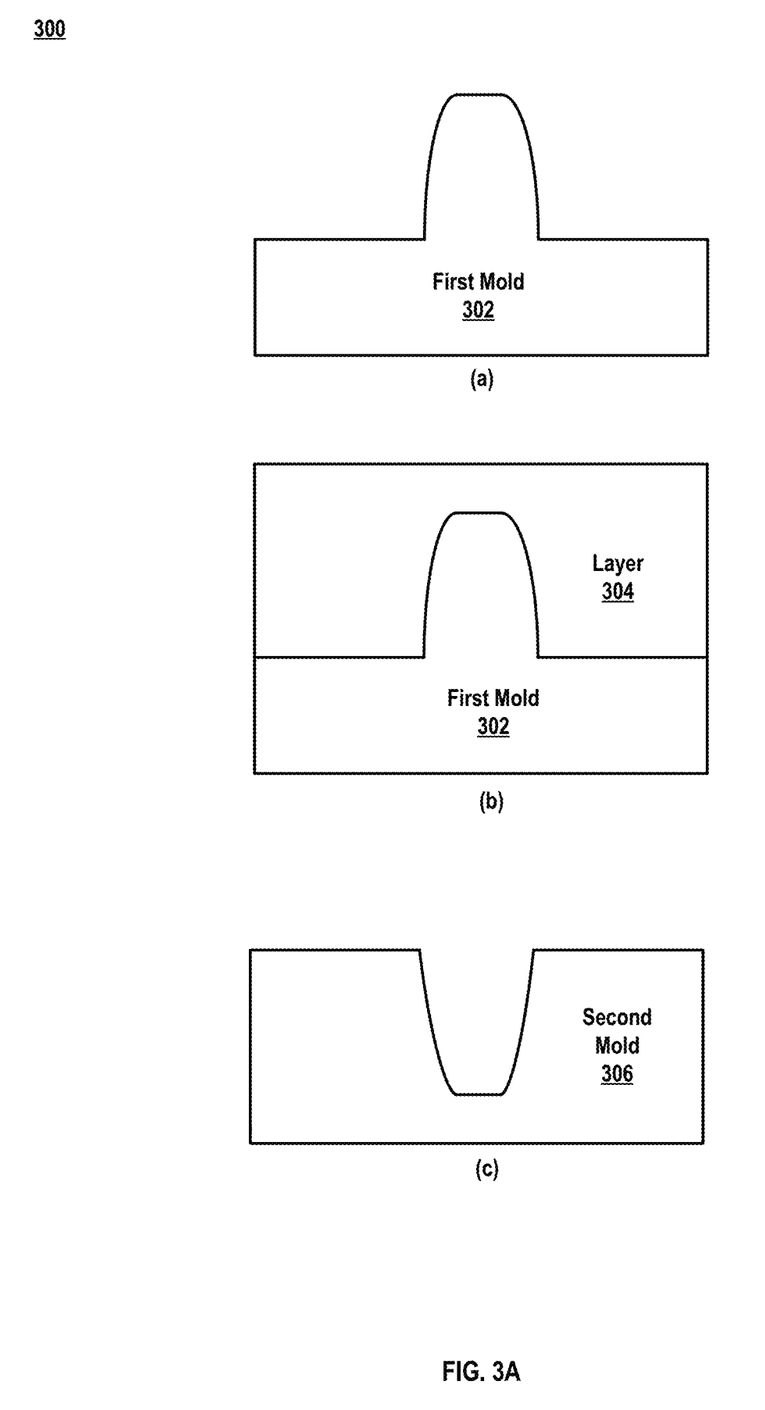
FIGS. 3A and 3B illustrate an exemplary process flow for fabricating a light collector, according to embodiments of the disclosure.
Figure 3B:
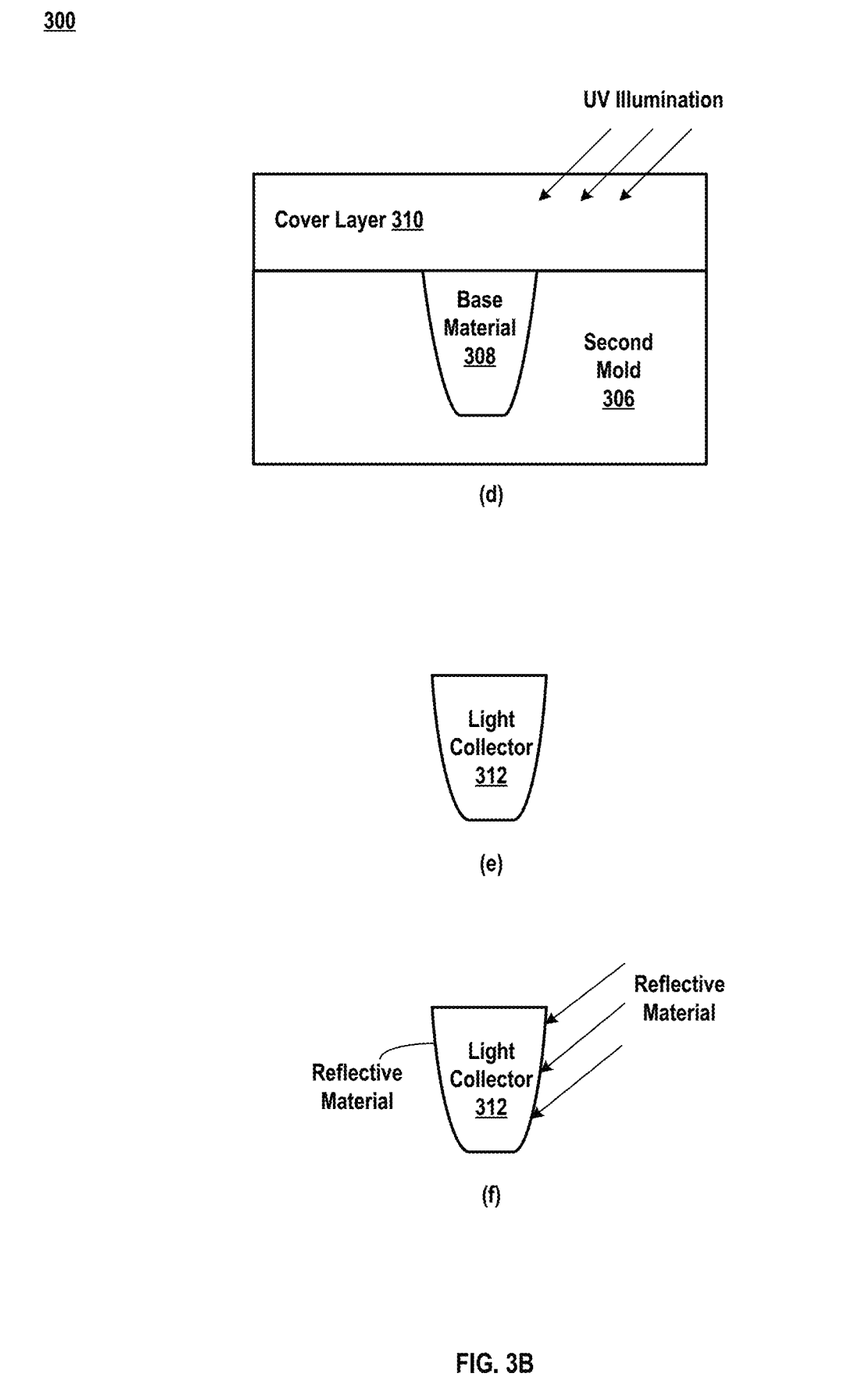
Figure 4:
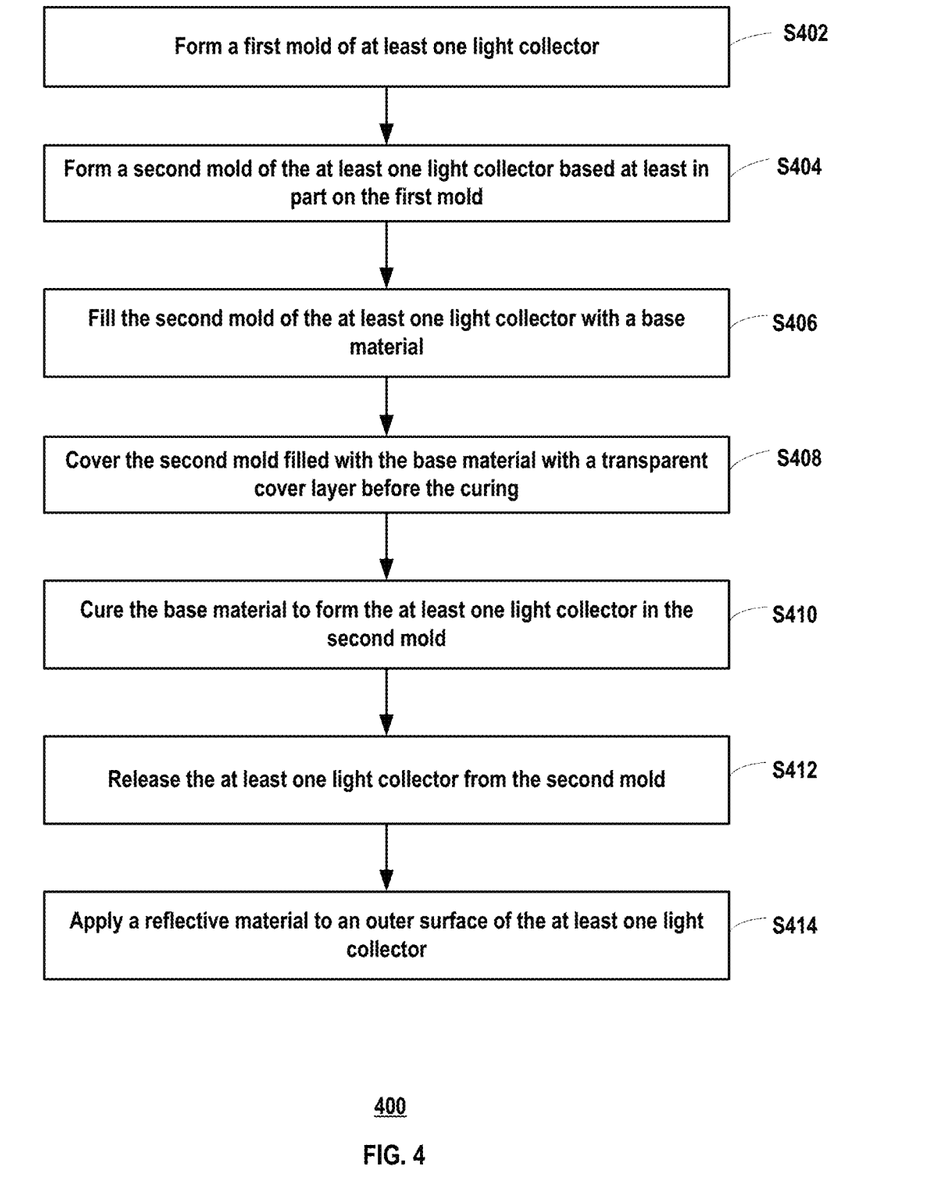
FIG. 4 illustrates a flow chart of an exemplary method for fabricating a light collector, according to embodiments of the disclosure.

FIGS. 3A and 3B illustrate an exemplary process flow 300 for fabricating light collector array 140 depicted in FIG. 1 and/or CPC 250 depicted in FIG. 2E, according to embodiments of the disclosure. Process flow 300 may include steps (a)-(f), which may be used to fabricate one single light collector (e.g., CPC 250) at a time or an array of light collectors such as light collector array 140 all together. FIG. 4 illustrates a flowchart of an exemplary method 400 for fabricating light collector array 140 depicted in FIG. 1 and/or CPC 250 depicted in FIG. 2E, according to embodiments of the disclosure. Method 400 may include steps S402-S414 as described below. Steps (a)-(f) in FIGS. 3A and 3B and steps S402-S414 in FIG. 4 may be performed by any type of fabrication system and/or device without departing from the scope of the present disclosure. It is to be appreciated that some of the steps may be optional, and some of the steps may be performed simultaneously, or in a different order than shown in FIG. 4. FIGS. 3A, 3B, and 4 will be described together.

Referring to FIG. 4, the fabrication process may begin at step S402. At S402, a first mold 302 of at least one light collector may be formed. An example of the first mold 302 is illustrated at step (a) in FIG. 3A. First mold 302 may be for a single light collector (e.g., such as CPC 250 of FIG. 2E) or a light collecting array (e.g., such as light collector array 140 of FIG. 1) that includes a plurality of light collectors. Moreover, first mold 302 may include one or more two-dimensional light collectors (e.g., such as a trough(s)), one or more three-dimensional light collector(s) (e.g., such as a set of solid body light collectors), or a mix of two-dimensional and three-dimensional light collectors. Each light collector of first mold 302 may have a CPC shape, a parabolic shape, a V-shape, a conical shape, or a spherical shape, just to name a few. In some embodiments, first mold 302 may be formed using computer numerical control (CNC) and/or three-dimensional (3D) printing.

When formed using CNC (also referred to as "reductive manufacturing"), first mold 302 may be formed through a reductive process by which layers and/or portions of a machinable slab, such as a tooling board and/or machining board, are removed. The machinable slab may be formed of metal, wood, plastic, ceramic, polyurethane, urethane, epoxy, carbon-fiber, or any other type of material that can be carved or portions removed using CNC equipment (e.g., drills, lathes, abrasives, etc.). To begin, a computer of the CNC equipment may receive a digital file, such as a computer-aided design (CAD) file, a building information modeling (BIM) file, or any 3D modeling file, that includes the dimensional information associated with light collector array 140 and/or CPC 250. Using the structural and/or dimensional information, the CNC equipment (e.g., a computer coupled to a mechanical machine) may generate a set of commands that are sent to a mechanical machine that removes layers of the machinable slab to eventually form first mold 302.

On the other hand, when formed using 3D printing (also referred to as "additive manufacturing"), successive layers of a material formed until first mold 302 is created. Each of these successive layers may represent a thinly sliced cross-section of first mold 302. The additive material used for forming each of the layers may include one or more of plastic, polymer, polyurethane, urethane, epoxy, resin, ceramic, metal, wood, or any other material that may be used in additive manufacturing. A computer of the 3D printing equipment may receive a digital file, such as a CAD file, a BIM file, or any 3D modeling file, that includes the dimensional information associated with light collector array 140 and/or CPC 250. Using the structural and/or dimensional information, the 3D printing equipment (e.g., a computer coupled to a mechanical machine) may generate a set of commands that are sent to a printing machine that adds layers of the additive material to eventually form first mold 302.

At step S404, a second mold 404 of the at least one light collector may be formed based at least in part on the first mold 302. An example of second mold 306 is illustrated at steps (b) and (c) of FIG. 3A. Once first mold 302 is formed, a layer 304 of material may be formed over first mold 302. Layer 304 may be a fluid or semifluid material that can be made to solidify such that layer 304 forms a reverse shape of first mold 302. For example, the fluid or semifluid material used for layer 304 may include polydimethalsiloxane (PDMS), polyurethane, urethane, epoxy, resin, metal, ceramic, rubber, polymer, plastic, or any material used in reverse mold making. Layer 304 may be cured using, e.g., heat, radiation, ultraviolet (UV) illumination, or any other process that solidifies layer 304. Once solidified, layer 304 may be released from first mold 302 to obtain second mold 306. For example, first mold 302 may be melted, etched, dissolved, or mechanically removed to obtain second mold 306. Thus, depending on the removal process, the material of first mold 302 and the material of layer 304 may have different properties such as melting temperature and/or reactivity to different etching and/or dissolving solutions such that first mold 302 is removed and second mold 306 remains. As shown in FIG. 3A, second mold 306 is a reverse mold of first mold 302, and hence, is a reverse mold of light collector array 140 and/or CPC 250.

At 406, the hollow space(s) of second mold 306 may be filled with a fluid or semifluid base material 308. An example of base material 308 within the hollow space(s) of second mold 306 is illustrated at step (d) of FIG. 3B. Base material 308 is the material used to form light collector array 140 and/or CPC 250, and thus, may be any material that is transparent to visible light when solidified. Non-limiting examples of base material 308 include, e.g., a polymer, a silicone, glass, plastic, just to name a few.

At 408, a cover layer 310 may be formed over second mold 306 and base material 308. Cover layer 310 may be glass, plastic, or any clear solid material. An example of cover layer 310 formed over second mold 306 and base material 308 is illustrated in step (d) of FIG. 3B.

At step 410, base material 308 may be cured to form light collector 312. An example of curing base material 308 is illustrated at step (d) in FIG. 3B. Base material 308 may be cured using, e.g., UV illumination, radiation, and/or heat. Although illustrated as a CPC in FIG. 3B, light collector 312 may be any shaped two-dimensional (e.g., trough) or three-dimensional light collector or light collector array without departing from the scope of the present disclosure.

At step 412, light collector 312 may be released from second mold 306. An example of light collector 312 released from second mold 306 is illustrated in step (e) of FIG. 3B. To release light collector 312, second mold 306 may be removed by various mechanisms. These mechanisms include, e.g., etching, dissolving, melting, or mechanical removal, just to name a few.

At step 414, a reflective coating 314 may be added to the exterior of light collector 312 since light collector 312 is a 3D light collector. However, when light collector 312 is a 2D "trough" light collection (not shown in FIGS. 3A and 3B), reflective coating 314 may be formed on an inner wall of the trough, or so long as the material that forms the body of the trough is transparent, an exterior wall of the trough. An example of reflective coating 314 is illustrated in step (f) of FIG. 3B. Reflective coating 314 may be any reflective metal or composite that can reflect light. For example, reflective coating 314 may include aluminum, gold, silver, copper, silicon, just to name a few. Reflective coating 314 may be formed using, e.g., spin coating, plasma deposition, chemical vapor deposition, dipping, or spraying, just to name a few.

As compared with known approaches, the techniques of FIGS. 3A, 3B, and 4 enable the manufacture of a light collector with a highly accurate shape, which may significantly enhance the light collection efficiency of such a light collector, and hence, the overall performance of an optical sensing system that uses a light collector manufactured using these techniques.

It is intended that the specification and examples be considered as exemplary only, with a true scope being indicated by the following claims and their equivalents.

What is claimed is:

1. A receiver of an optical sensing system, comprising:
a mask configured to resonate during a scanning procedure performed by the optical sensing system, wherein the mask comprises a frame beginning pattern configured to identify a start of a frame at a new scanning angle captured during the scanning procedure;
a photodetector array positioned on a first side of the mask, the photodetector array configured to detect light that passes through the mask during the scanning procedure to generate the frame; and
a light collector array aligned with the photodetector array and configured to concentrate the light that passes through the mask during the scanning procedure before directing the light to the photodetector array.

2. The receiver of claim 1, wherein:
the mask is a Hadamard mask comprising a coded pattern configured to provide sub-pixelization of the frame,
each coded pattern comprises a plurality of coded regions arranged in a plurality of rows,
each of the plurality of rows comprise a N number of coded regions, and
each coded region is designed to either pass or block the light.

3. The receiver of claim 2, wherein:
the photodetector array comprises a plurality of photodetectors each of which corresponding to one of the coded regions in a row of the coded pattern of the Hadamard mask, and
the light collector array comprises a plurality of light collectors each of which corresponding to one of the plurality of photodetectors.

4. The receiver of claim 1, wherein the light collector array comprises an array of two-dimensional collectors or an array of three-dimensional collectors.

5. The receiver of claim 4, wherein the array of two-dimensional collectors includes V-trough collectors or compound parabolic concentrator (CPC) trough collectors.

6. The receiver of claim 4, wherein the array of three-dimensional collectors includes pyramid collectors or compound parabolic concentrator (CPC) collectors.

7. An optical sensing system, comprising:
a transmitter configured to emit light towards an environment during a scanning procedure; and
a receiver comprising:
a mask configured to resonate during a scanning procedure performed by the optical sensing system, wherein the mask comprises a frame beginning pattern configured to identify a start of a frame at a new scanning angle captured during the scanning procedure;
a photodetector array positioned on a first side of the mask, the photodetector array configured to detect light that passes through the mask during the scanning procedure to generate the frame; and
a light collector array aligned with the photodetector array and configured to concentrate the light that passes through the mask during the scanning procedure before directing the light to the photodetector array.

8. The receiver of claim 2, further comprising:
a slit apparatus positioned on a second side of the mask opposite to the first side,
wherein a slit in the slit apparatus has a same width as a single row of the plurality of rows.

9. The receiver of claim 8, wherein to capture the frame,
the mask is configured to resonate to align each of the plurality of rows with the photodetector array in a sequential manner; and the photodetector array is configured to sequentially detect light passing through the slit and impinging on each of the plurality of rows individually.

10. The receiver of claim 1, wherein the mask further comprises:

an actuator configured to generate a displacement force that causes the mask to resonate during the scanning procedure.

11. The receiver of claim 10, wherein the mask further comprises:

at least one displacement amplifier coupled to the actuator and configured to amplify the displacement force generated by the actuator during the scanning procedure before applied to the mask.

12. The optical sensing system of claim 7, wherein:

the mask is a Hadamard mask comprising a coded pattern configured to provide sub-pixelization of the frame;

each coded pattern comprises a plurality of coded regions arranged in a plurality of rows;

each of the plurality of rows comprises a N number of coded regions; and each coded region is designed to either pass or block the light.

13. The optical sensing system of claim 12, wherein:

the photodetector array comprises a plurality of photodetectors each of which corresponding to one of the coded regions in a row of the coded pattern of the Hadamard mask; and the light collector array comprises a plurality of light collectors each of which corresponding to one of the plurality of photodetectors.

14. The optical sensing system of claim 7, wherein the light collector array comprises an array of two-dimensional collectors.

15. The optical sensing system of claim 14, wherein the array of two-dimensional collectors includes V-trough collectors or compound parabolic concentrator (CPC) trough collectors.

16. The optical sensing system of claim 7, wherein the light collector array comprises an array of three-dimensional collectors.

17. The optical sensing system of claim 16, wherein the array of three-dimensional collectors includes pyramid collectors or compound parabolic concentrator (CPC) collectors.

18. The optical sensing system of claim 12, further comprising:

a slit apparatus positioned on a second side of the mask opposite to the first side, wherein a slit in the slit apparatus has a same width as a single row of the plurality of rows.

19. The optical sensing system of claim 18, wherein to capture the frame, the mask is configured to resonate to align each of the plurality of rows with the photodetector array in a sequential manner; and the photodetector array is configured to sequentially detect light passing through the slit and impinging on each of the plurality of rows individually.

20. The optical sensing system of claim 7, wherein the mask further comprises:

an actuator configured to generate a displacement force that causes the mask to resonate during the scanning procedure.

* * * * *